(12) United States Patent
Zhang et al.

(10) Patent No.: US 10,679,937 B2
(45) Date of Patent: Jun. 9, 2020

(54) DEVICES AND METHODS OF FORMING LOW RESISTIVITY NOBLE METAL INTERCONNECT

(71) Applicant: GLOBALFOUNDRIES Inc., Grand Cayman (KY)

(72) Inventors: Xunyuan Zhang, Albany, NY (US); Frank W. Mont, Troy, NY (US); Errol Todd Ryan, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/785,665

(22) Filed: Oct. 17, 2017

(65) Prior Publication Data

US 2018/0040555 A1 Feb. 8, 2018

Related U.S. Application Data

(62) Division of application No. 15/168,899, filed on May 31, 2016, now Pat. No. 9,831,174.

(51) Int. Cl.
*H01L 23/522* (2006.01)
*H01L 23/532* (2006.01)
(Continued)

(52) U.S. Cl.
CPC .... *H01L 23/5226* (2013.01); *H01L 21/02244* (2013.01); *H01L 21/2855* (2013.01);
(Continued)

(58) Field of Classification Search
CPC ......... H01L 21/76849; H01L 21/76864; H01L 21/76856; H01L 21/76858;
(Continued)

(56) References Cited

U.S. PATENT DOCUMENTS

| 4,975,386 A | 12/1990 | Rao |
| 6,022,808 A | 2/2000 | Nogami et al. |

(Continued)

FOREIGN PATENT DOCUMENTS

| CN | 101431046 A | 5/2009 |
| CN | 104025262 A | 9/2014 |

(Continued)

OTHER PUBLICATIONS

Helmenstine, Anne Marie, Ph.D. "Noble Metals List and Properties." ThoughtCo, Dec. 2, 2019, thoughtco.com/introduction-to-noble-metals-608444. (Year: 2019).*

(Continued)

*Primary Examiner* — Marcos D. Pizarro
*Assistant Examiner* — Antonio B Crite
(74) *Attorney, Agent, or Firm* — Thompson Hine LLP; Francois Pagette

(57) ABSTRACT

Devices and methods of fabricating integrated circuit devices for forming low resistivity interconnects are provided. One method includes, for instance: obtaining an intermediate semiconductor interconnect device having a substrate, a cap layer, and a dielectric matrix including a set of trenches and a set of vias; depositing a barrier layer along a top surface of the semiconductor interconnect device; depositing and annealing a metal interconnect material over a top surface of the barrier layer, wherein the metal interconnect material fills the set of trenches and the set of vias; planarizing a top surface of the intermediate semiconductor interconnect device; exposing a portion of the barrier layer between the set of trenches and the set of vias; and depositing a dielectric cap. Also disclosed is an intermediate device formed by the method.

12 Claims, 12 Drawing Sheets

(51) Int. Cl.
  *H01L 21/02* (2006.01)
  *H01L 21/285* (2006.01)
  *H01L 21/768* (2006.01)
  *H01L 23/528* (2006.01)

(52) U.S. Cl.
  CPC .. *H01L 21/28556* (2013.01); *H01L 21/28568* (2013.01); *H01L 21/7682* (2013.01); *H01L 21/7684* (2013.01); *H01L 21/7685* (2013.01); *H01L 21/76856* (2013.01); *H01L 21/76864* (2013.01); *H01L 23/528* (2013.01); *H01L 23/53252* (2013.01); *H01L 23/53295* (2013.01); *H01L 21/76834* (2013.01); *H01L 21/76865* (2013.01); *H01L 23/5222* (2013.01)

(58) Field of Classification Search
  CPC ........... H01L 21/76805; H01L 21/7682; H01L 23/5226; H01L 23/528; H01L 2221/1042; H01L 2221/1047; H01L 23/53295; H01L 23/53252; H01L 23/53242; H01L 21/7685; H01L 21/28568
  See application file for complete search history.

(56) References Cited

U.S. PATENT DOCUMENTS

| | | | |
|---|---|---|---|
| 6,515,368 | B1 | 2/2003 | Lopatin et al. |
| 6,723,634 | B1 | 4/2004 | Ngo et al. |
| 7,879,683 | B2 | 2/2011 | Al-Bayati et al. |
| 9,159,610 | B2 | 10/2015 | Zhang et al. |
| 2006/0273431 | A1 | 12/2006 | He et al. |
| 2008/0108219 | A1 | 5/2008 | Huebinger et al. |
| 2009/0321935 | A1 | 12/2009 | O'Brien et al. |
| 2011/0101529 | A1* | 5/2011 | Kao .................. H01L 23/53238 257/751 |
| 2011/0250750 | A1 | 10/2011 | Morinaga |
| 2012/0032344 | A1 | 2/2012 | Usami |
| 2012/0168957 | A1* | 7/2012 | Srivastava ........ H01L 21/31144 257/774 |
| 2013/0069234 | A1 | 3/2013 | Lee et al. |
| 2013/0320494 | A1 | 12/2013 | Zhu et al. |
| 2014/0191401 | A1 | 7/2014 | Fischer |
| 2014/0264908 | A1* | 9/2014 | Lee .................. H01L 23/49827 257/774 |
| 2015/0162240 | A1* | 6/2015 | Chiu ................. H01L 21/76877 438/653 |
| 2015/0255389 | A1* | 9/2015 | Tsai .................. H01L 21/76885 257/751 |
| 2015/0287634 | A1 | 10/2015 | Agarwal et al. |
| 2015/0348835 | A1 | 12/2015 | Deng et al. |
| 2016/0049373 | A1* | 2/2016 | Peng .................. H01L 23/5226 257/751 |
| 2016/0276260 | A1* | 9/2016 | Liou ................. H01L 23/53295 |
| 2017/0084540 | A1 | 3/2017 | Briggs et al. |
| 2017/0140979 | A1* | 5/2017 | Lin .................... H01L 29/0649 |

FOREIGN PATENT DOCUMENTS

| | | |
|---|---|---|
| CN | 104364903 A | 2/2015 |
| CN | 104576518 A | 4/2015 |
| EP | 0506710 A1 | 10/1992 |
| KR | 20030083174 A | 10/2003 |
| KR | 20040000704 A | 1/2004 |

OTHER PUBLICATIONS

Helmenstine, Anne Marie, Ph.D. "Chart of Noble Metals and Precious Metals." ThoughtCo, Oct. 19, 2018, thoughtco.com/chart-of-noble-metals-precious-metals-608466. (Year: 2018).*
Chinese Intellectual Property Office, Official Action issued in Chinese Patent Application No. 201710398591.6 dated Aug. 1, 2019 and translation thereof.
U.S. Appl. No. 15/168,930, filed May 31, 2016, titled Devices and Methods of Forming Low Resistivity Noble Metal Interconnect With Improved Adhesion.

* cited by examiner

DEVICES AND METHODS OF FORMING LOW RESISTIVITY NOBLE METAL INTERCONNECT

CROSS-REFERENCE TO RELATED APPLICATIONS

This application is a divisional application of U.S. patent application Ser. No. 15/168,899, filed 31 May 2016, and entitled "DEVICES AND METHODS OF FORMING LOW RESISTIVITY NOBLE METAL INTERCONNECT," the entirety of which is hereby incorporated herein by reference.

FIELD OF THE INVENTION

The present invention relates to semiconductor devices and methods of fabricating semiconductor devices, and more particularly, to devices and methods of forming low resistivity metal interconnects having noble metals.

BACKGROUND OF THE INVENTION

For 5 nm and beyond nodes, with the continually increasing demand for smaller circuit structures and faster device performance, copper line resistivity begins to climb, decreasing the performance of the nodes. The development of 5 nm nodes and smaller will likely require lowering the resistivity of the lines in the nodes.

Therefore, it may be desirable to develop methods of fabricating nodes with lines that have a lower resistivity than copper at such a small size.

BRIEF SUMMARY

The shortcomings of the prior art are overcome and additional advantage are provided through the provisions, in one aspect, a method that includes, for instance: obtaining an intermediate semiconductor interconnect device having a substrate, a cap layer, and a dielectric matrix including a set of trenches and a set of vias; depositing a barrier layer along a top surface of the semiconductor interconnect device; depositing a metal interconnect material over a top surface of the barrier layer, wherein the metal interconnect material fills the set of trenches and the set of vias; annealing the metal interconnect material; planarizing a top surface of the intermediate semiconductor interconnect device removing the metal interconnect material above the set of trenches and the set of vias; exposing a portion of the barrier layer between the set of trenches and the set of vias; and depositing a dielectric cap on a set of outer surfaces of the barrier layer and over the intermediate semiconductor interconnect device.

In another aspect, an intermediate device is provided which includes, for instance: a substrate; a cap layer; a dielectric matrix; a set of vias extending through the cap layer; a set of trenches extending into the dielectric matrix, wherein the set of trenches and the set of vias include a noble metal; and a dielectric cap.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain integrated circuits, which provide advantages over the above noted, existing semiconductor devices and fabrication processes. Advantageously, the integrated circuit device fabrication processes disclosed herein provide for semiconductor devices with a lower line resistivity than previously possible using traditional copper lines.

Figure 1:
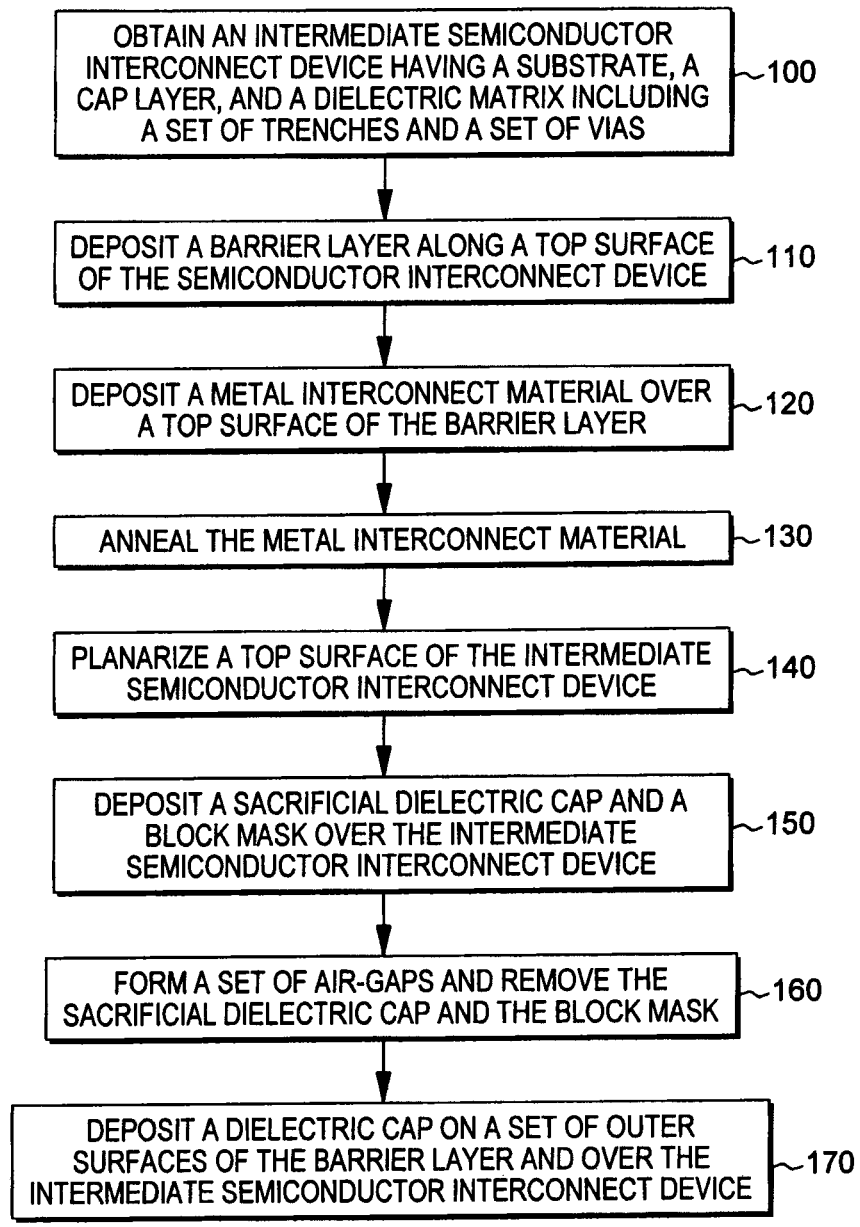
FIG. 1 depicts one embodiment of a method for forming an intermediate semiconductor interconnect structure, in accordance with one or more aspects of the present invention.

In one aspect, in one embodiment, as shown in FIG. 1, an integrated circuit device formation process in accordance with one or more aspects of the present invention may include, for instance: obtaining an intermediate semiconductor interconnect device having a substrate, a cap layer, and a dielectric matrix including a set of trenches and a set of vias 100; depositing a barrier layer along a top surface of the semiconductor interconnect device 110; depositing a metal interconnect material over a top surface of the barrier layer 120; annealing the metal interconnect material 130; planarizing a top surface of the intermediate semiconductor interconnect device 140; depositing a sacrificial dielectric cap and a block mask over the intermediate semiconductor interconnect device 150; forming a set of air-gaps and removing the sacrificial dielectric cap and the block mask 160; and depositing a dielectric cap on a set of outer surface of the barrier layer and over the intermediate semiconductor interconnect device 170.

FIGS. 2-8 depict, by way of example only, one detailed embodiment of a portion of a semiconductor device formation process and a portion of an intermediate semiconductor interconnect structure, in accordance with one or more aspects of the present invention. Note that these figures are not drawn to scale in order to facilitate understanding of the invention, and that the same reference numerals used throughout different figures designate the same or similar elements.

Figure 2:
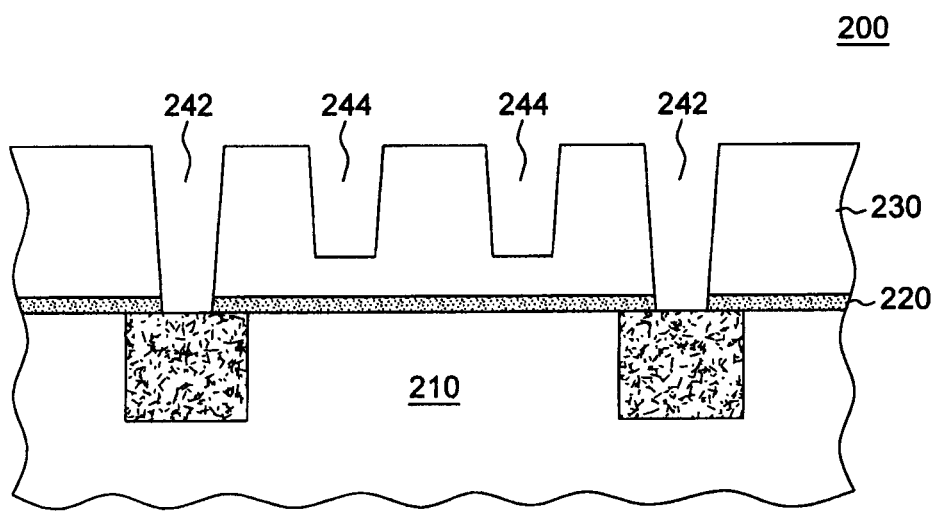
FIG. 2 depicts a cross-sectional elevation view of one embodiment of an intermediate semiconductor interconnect structure having a substrate, a cap layer, and a dielectric matrix including a set of trenches and a set of vias, in accordance with one or more aspects of the present invention.

FIG. 2 shows a portion of an intermediate semiconductor device generally denoted 200, depicted at an intermediate semiconductor fabrication stage. The device 200 may have been processed through initial device processing steps in accordance with the design of the device 200 being fabricated. For example, the device 200 may include, for instance, a substrate 210 with a cap layer 220, which may include a dielectric material, disposed on the substrate 210. The substrate 210 may be any suitable material, for example, silicon. Additionally, dielectric matrix 230 may be deposited on substrate 210 or cap layer 220. Dielectric matrix may include one or more dielectric materials, and may include a mixed matrix of materials or a plurality of layers of materials (not shown). Dielectric matrix 230 may include a set of vias 242 and a set of trenches 244. As illustrated in FIG. 2, the set of vias 242 may extend through the cap layer 220 to features below, whilst the set of trenches 244 may only extend into the dielectric matrix 230.

In another embodiment (not shown), the substrate of device 200 may be, for example, a silicon on insulator (SOI) substrate (not shown). For example, the SOI substrate may include an isolation layer (not shown), which may be a local buried oxide region (BOX) or any suitable material for electrically isolating transistors, aligned with the gate structure. In some embodiments, the device is a portion of a back end of line (BEOL) portion of an integrated circuit (IC).

As depicted in FIG. 2, using lithography and etching processes, the dielectric matrix 230 and/or the cap layer 220 may have been etched in the dielectric matrix 230 to define the set of vias 242 and the set of trenches 244. The etching may be performed by any suitable etching process, for example, a directional reactive ion etching (RIE).

Figure 3:
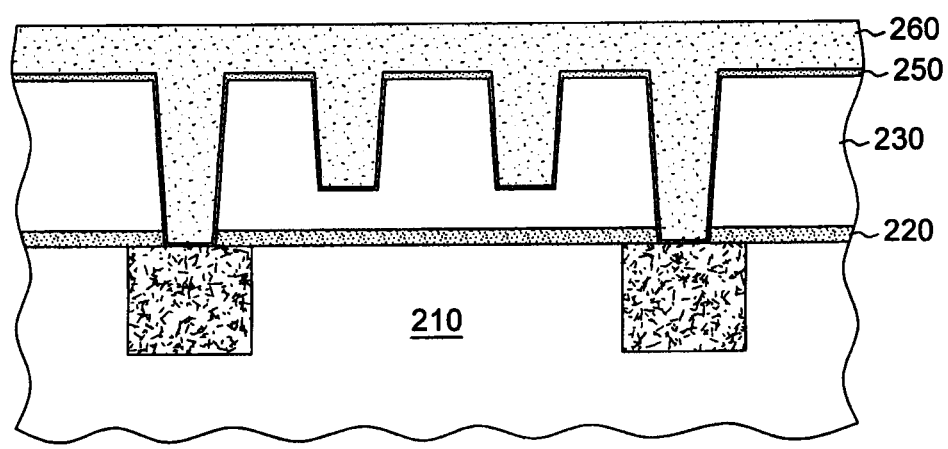
FIG. 3 depicts the structure of FIG. 2 after depositing a barrier layer and a metal interconnect material, in accordance with one or more aspects of the present invention.

As depicted in FIG. 3, a barrier layer 250 may be deposited along a top surface of the device 200 by atomic layer deposition (ALD), chemical vapor deposition (CVD), physical vapor deposition (PVD), or any other suitable deposition technique now known or later developed. For instance, the barrier layer 250 may have a component of tantalum (Ta), titanium (Ti), or manganese (Mn) and may be less than approximately 3 nanometers (nm) thick, and in some embodiments, less than approximately 1.5 nm thick. Any deposition capable of forming a consistent thin film or thin layer of less than 3 nm which can conform to a varied surface, as illustrated in FIG. 3, can be used to deposit the barrier layer 250.

As also depicted in FIG. 3, following deposition of the barrier layer 250, a metal interconnect material 260 is deposited over a top surface of the barrier layer 250 by ALD or CVD in some embodiments. The metal interconnect material is deposited, in some embodiments, between approximately 10 nm and approximately 20 nm in thickness, such that it fill the set of vias 242 (FIG. 2) and the set of trenches 244 (FIG. 2). The metal interconnect material 260 can include any noble metal, including but not limited to: ruthenium (Ru), niobium (Nb), rhodium (Rh), iridium (Ir), and platinum (PT). Following deposition of the metal interconnect material 260, thermal anneal of the material in a range of approximately 350° C. to approximately 500° C. can help solidify the material. While copper (Cu) has traditionally been the interconnect material of choice, as the line width continues to get smaller for device, the resistivity of copper starts to grow. In contrast, noble metals can have a more desirable resistivity at smaller sizes.

For instance, Ru thin films have a nearly constant resistivity from 20 nm to 6 nm, unlike copper, which climbs consistently between 20 nm and 6 nm. At approximately 5 nm, Ru can have nearly the same resistivity as Cu, and can have a lower resistivity below 5 nm. Additionally, Ru shows no failure due to electromigration (EM), unlike many other interconnect materials. The time dependent dielectric breakdown (TDDB) of noble metal thin films can be at least 10 times better than copper. However, as will be further described below, the resistivity of the metal interconnect material 260 can be lowered even further by increasing the resistance of the layer adjacent to the metal interconnect material 260, such as barrier layer 250. Thus, altering the barrier layer 250 in terms of the composition to increase the resistance can lower the resistance of the metal interconnect material 260.

Figure 4:
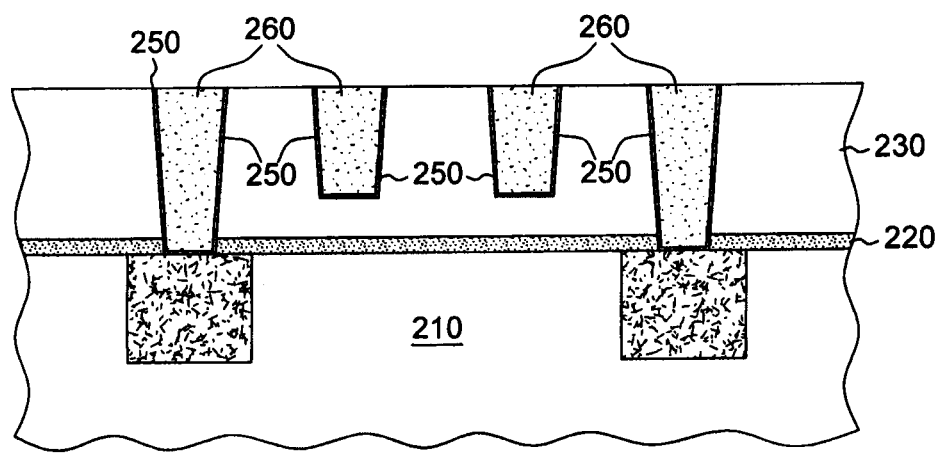
FIG. 4 depicts the structure of FIG. 3 after planarizing a top surface of the intermediate semiconductor interconnect structure, in accordance with one or more aspects of the present invention.

As depicted in FIG. 4, using chemical mechanical polishing, a top surface of device 200 can be planarized and polished, removing excess metal interconnect material 260 and providing a smooth surface on which to continue device fabrication. In one embodiment, following this planarizing, barrier layer 250 can be oxidized (not shown) in order to lower the resistance of metal interconnect material 260. Oxidizing barrier layer 250 can be achieved by annealing the structure in inert ambient air, in some instances with less than approximately 1% oxygen, without damaging the metal interconnect material 260. In this embodiment, the resistance of the metal interconnect material 260 can be significantly lowered.

Figure 5:
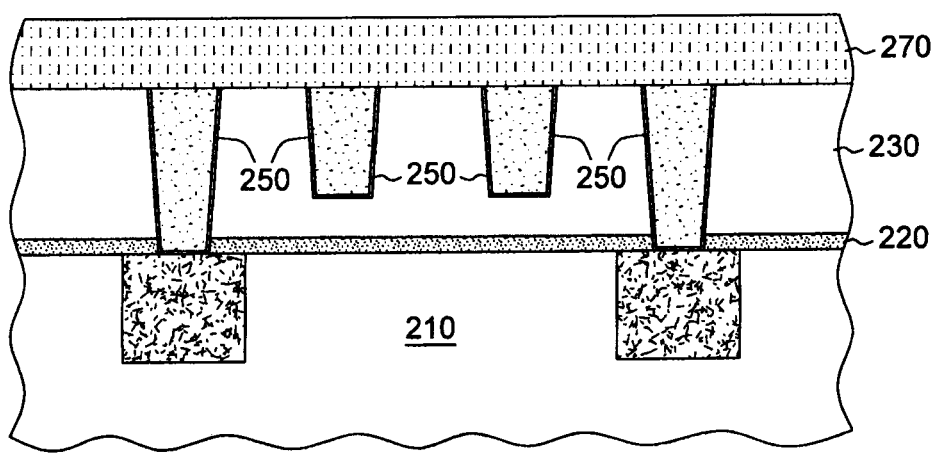
FIG. 5 depicts the structure of FIG. 4 after depositing a sacrificial dielectric cap, in accordance with one or more aspects of the present invention.

As depicted in FIG. 5, a sacrificial dielectric cap 270 can be deposited over device 200. This cap is considered sacrificial as it is used for masking of the underlying structure, and not for functioning of the end device.

Figure 6:
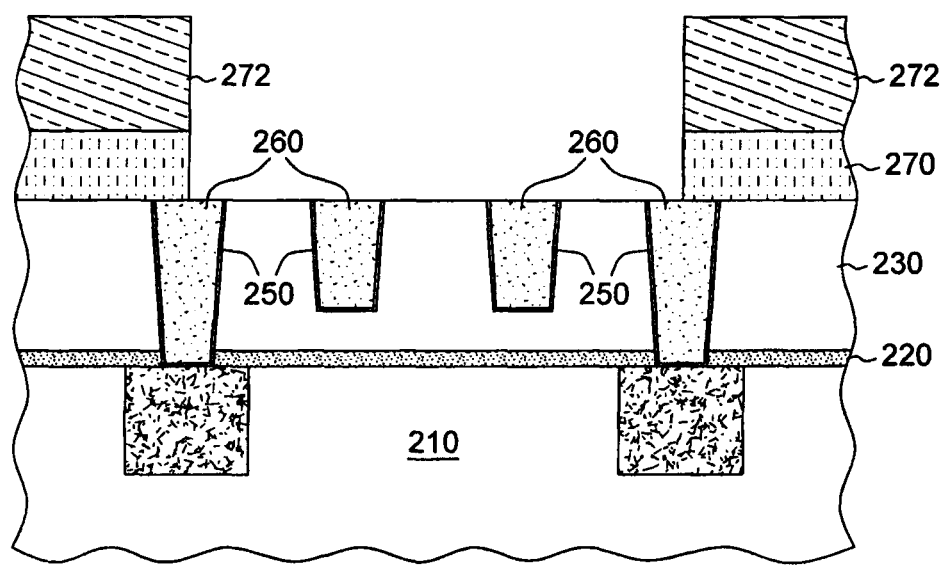
FIG. 6 depicts the structure of FIG. 5 after depositing a block mask and forming an opening, in accordance with one or more aspects of the present invention.

As depicted in FIG. 6, a block mask 272 can be formed, for example using standard lithography and etch techniques, on a top surface of sacrificial dielectric cap 270, and the sacrificial dielectric cap 270 can be removed to expose and form one or more openings over the set of trenches 244 and the set of vias 242 using any lithography techniques. Following use of the block mask 272, removal via etching techniques may be performed.

Figure 7:
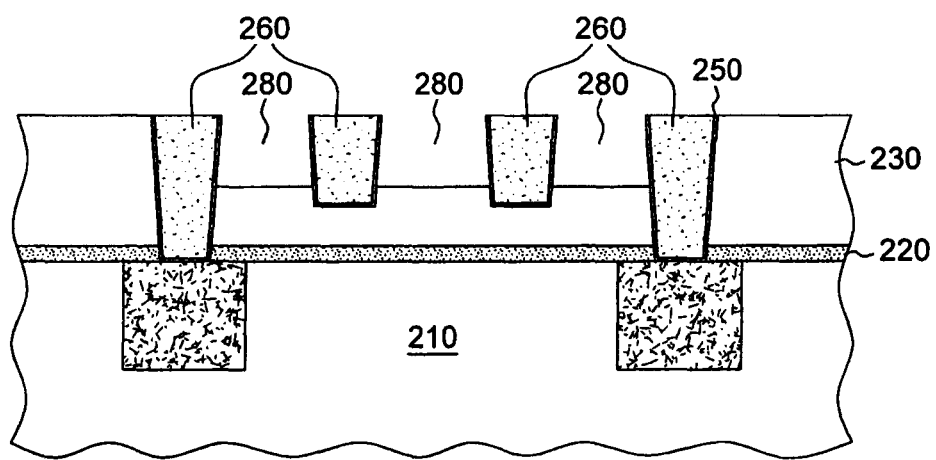
FIG. 7 depicts the structure of FIG. 6 after forming a set of air-gaps and removing the sacrificial dielectric cap and the block mask, in accordance with one or more aspects of the present invention.

As depicted in FIG. 7, a portion of the barrier layer 250 between at least some of the set of vias 242 and the set of trenches 244 may be exposed, for instance, by forming a set of air-gaps 280 within the dielectric matrix 230. In some embodiments, regions of the dielectric matrix 230 may be damaged, for instance, between some or all of the set of trenches 244 and the set of vias 242, for example, to form the set of air-gaps 280. In some embodiments, $H_2$ and $N_2$ plasma is used to damage the dielectric matrix 230. The damaged material can be removed, for instance, with diluted hydrofluoric acid, leaving air-gaps 280 between at least some of the set of vias 242 and the set of trenches 244. At the same time, sacrificial dielectric cap 270 and block mask 272 may be removed with the same material.

Figure 8A:
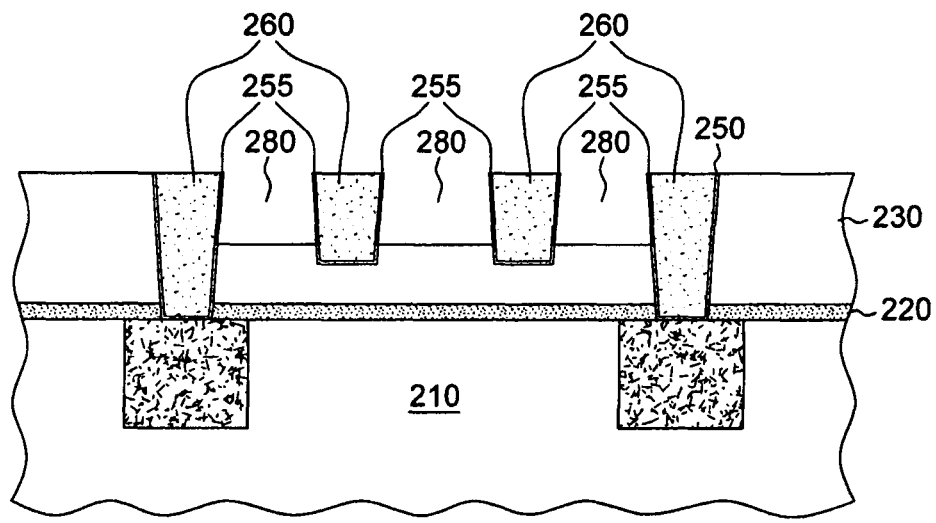
FIG. 8a depicts the structure of FIG. 7 after oxidizing exposed barrier layers, in accordance with one or more aspects of the present invention.

As depicted in FIG. 8a, forming air-gaps 280 leaves portions 255 of the barrier layer 250 exposed, typically the portions covering all or some of the side surfaces of the metal interconnect material 260 that fills the set of vias 242 and the set of trenches 244. These portions of the barrier layer 255 may be oxidized in order to increase their resistivity, effectively lowering the resistivity of the metal interconnect material 260. This oxidation may occur by exposure to a wet chemical. In some embodiments, wherein the barrier layer 250 includes a metal component of Ta or Ti, the wet chemical can include hydrogen peroxide ($H_2O_2$). The metal interconnect material 260 is harder to oxidize, especially at room temperature, so effectively only the exposed barrier layer 250 oxidizes.

Figure 8B:
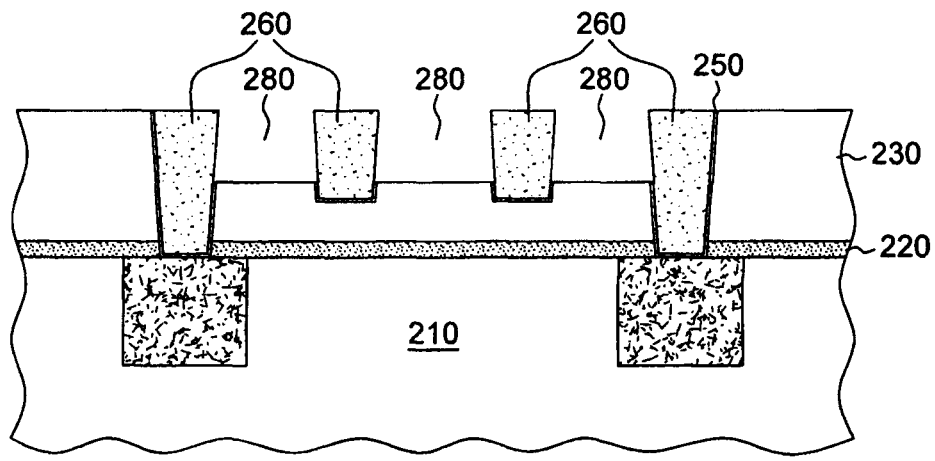
FIG. 8b depicts the structure of FIG. 7 after removing exposed barrier layers, in accordance with one or more aspects of the present invention.

In alternative embodiments, as depicted in FIG. 8b, the exposed portions of barrier layer 250 may be removed rather than oxidized. Removal of the barrier layer 250 allows for the metal interconnect material 260 to interface directly with a dielectric cap 290 (FIG. 9b), described further below. The dielectric cap 260 will have a higher resistance than barrier layer 250, thus lowering the resistance of metal interconnect material 260 in the final device. The exposed portions of the barrier layer 250 can be removed by exposure to a wet chemical or by etching of any necessary technique.

Figure 9A:
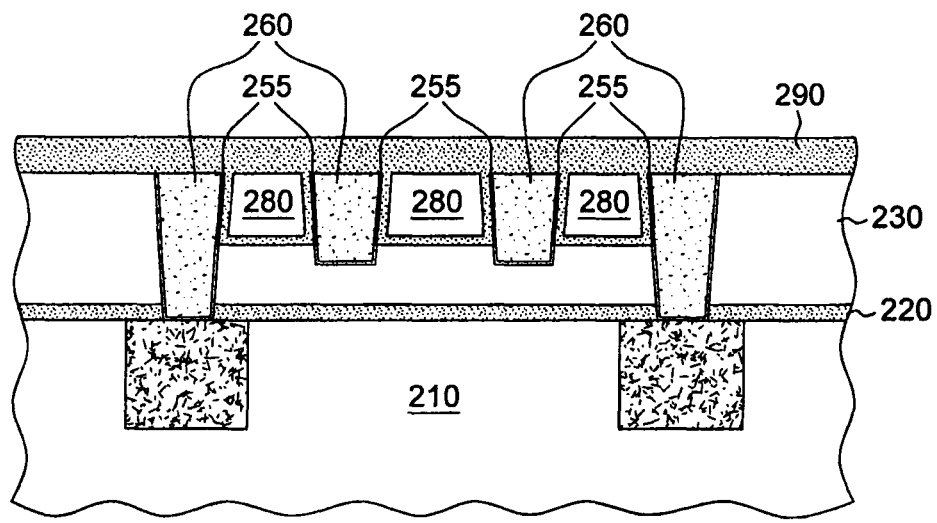
FIG. 9a depicts the structure of FIG. 8a after depositing a dielectric cap around the oxidized exposed barrier layers, in accordance with one or more aspects of the present invention.

As depicted in FIG. 9a, a dielectric cap 290 may be deposited on a set of outer surfaces of the barrier layer 250 and over the intermediate semiconductor interconnect device 200. The dielectric cap 290 can partially coat the barrier layer 250, but leaving air-gaps 280 (FIG. 7) intact and covered by dielectric cap 290.

Figure 9B:
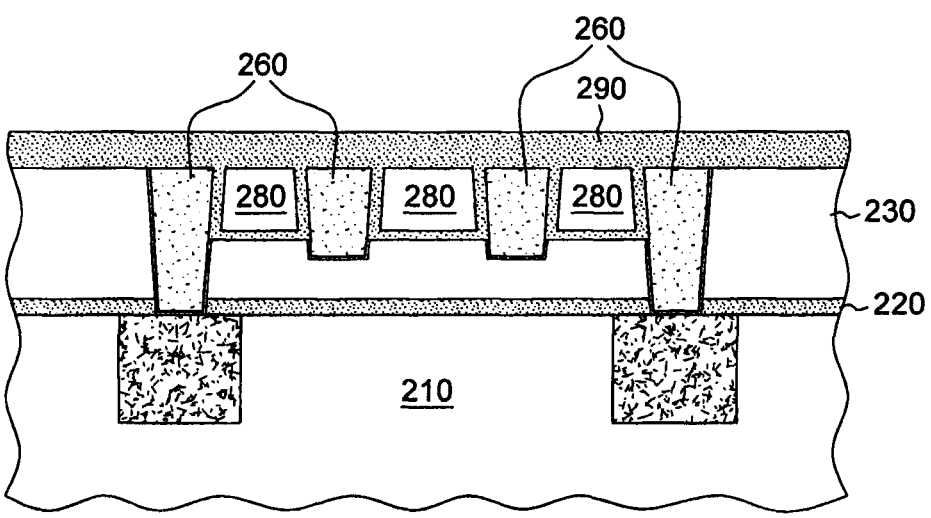
FIG. 9b depicts the structure of FIG. 8b after depositing a dielectric cap following removal of the exposed barrier layers, in accordance with one or more aspects of the present invention.

As depicted in FIG. 9b, the dielectric cap 290 can coat the exposed metal interconnect material 260, also leaving air-gaps 280 (FIG. 7) intact. In contrast to FIG. 9a, the material of the dielectric cap, which may include SiN or other dielectric materials, will act as the interface for metal interconnect material 260. This material can be chosen to have a high resistivity, which will lower the effective resistance of metal interconnect material 260 in the end IC.

Figure 10:
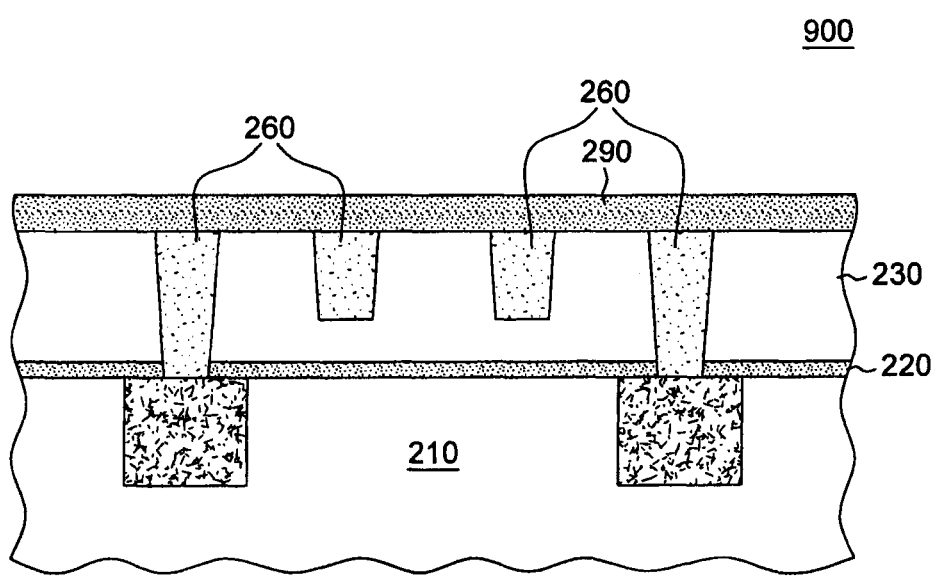
FIG. 10 depicts a cross-sectional elevation view of one embodiment of an intermediate device having a substrate, a cap layer, a dielectric matrix, a set of trenches, a set of vias, and a dielectric cap, in accordance with one or more aspects of the present invention.

FIG. 10 depicts an intermediate device 900, which according to some embodiments, includes a substrate 210, a cap layer 220, a dielectric matrix 230, a set of vias 242 extending through the cap layer 220, a set of trenches 244 extending into the dielectric matrix 230, and a dielectric cap 290. In these embodiments, the set of trenches 244 and the set of vias 242 include a noble metal. The other materials are as described above.

Figure 11:
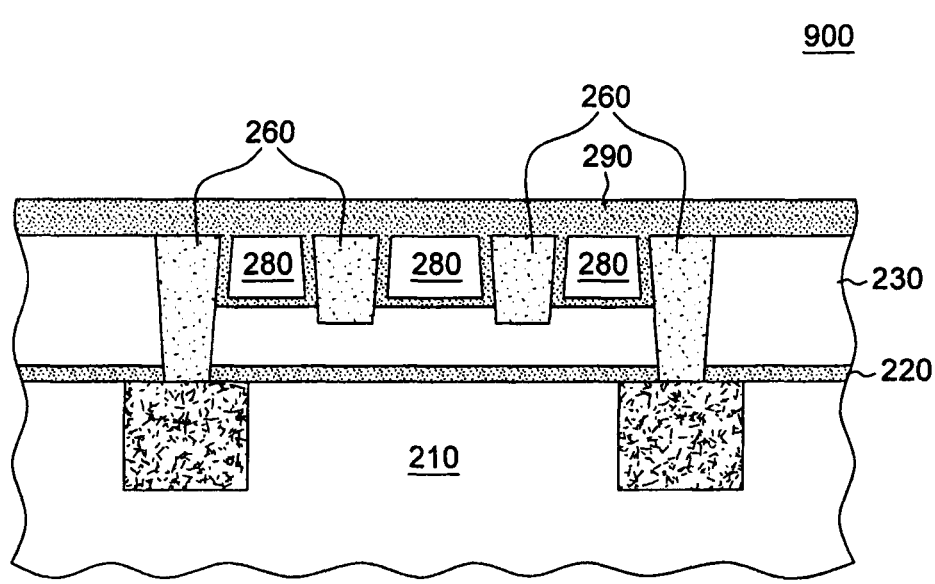
FIG. 11 depicts the device of FIG. 10 with a set of air-gaps, in accordance with one or more aspects of the present invention.

As depicted in FIG. 11, intermediate device 900 can include a set of air-gaps 280 between at least some of the set of vias 242 and the set of trenches 244. As can be seen, when air-gaps 280 are present, dielectric cap 290 may line the air-gaps 280.

Figure 12:
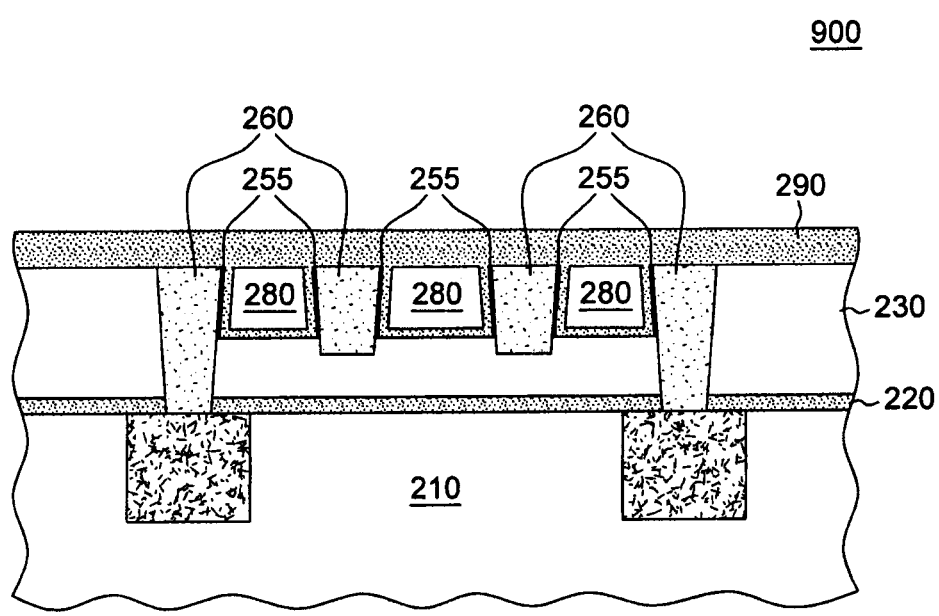
FIG. 12 depicts the device of FIG. 11 with a barrier layer around the set of vias and the set of trenches.

As depicted in FIG. 12, a barrier layer 250 surrounds the set of vias 242 and the set of trenches 244, however the barrier layer 255 in the vicinity of the set of air-gaps 280 (depicted orange in informal drawings) is an oxidized material of one of the above disclosed barrier layer materials with the component of Ta or Ti. In some embodiments, the entirety of barrier layer 250 may be oxidized.

It should be appreciated that the novel intermediate semiconductor interconnect devices and methods of forming the same disclosed above lower the resistance of BEOL interconnect formations and lines. According to embodiments, surface scatter of the device is reduced by altering the material of the interconnect itself, and increasing the resistance of the barrier layer decreases the resulting resistance of the interconnect material. Noble metals as interconnect materials are advantageous as the electromigration phenomenon is reduced, in part due to the higher melting point of the metals. Additionally, noble metals are more resistant to oxidation, allowing for easier oxidation of the barrier layers.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A structure comprising:
   a dielectric matrix;
   a first via extending completely through the dielectric matrix;
   a second via extending completely through the dielectric matrix;
   a trench extending partially through the dielectric matrix, the trench arranged laterally between the first via and the second via;
   a first interconnect in the first via;
   a second interconnect in the second via;
   a third interconnect in the trench;
   a barrier layer including a first portion and a second portion lining each of the first via, the second via, and the trench,
   a first air-gap arranged laterally between the trench and the first via; and
   a second air-gap arranged laterally between the trench and the second via,
   wherein the first portion of the barrier layer is an oxide, the second portion of the barrier layer is a metal, the first air-gap and the second air-gap are fully surrounded by respective portions of dielectric material, and the first interconnect, the second interconnect, and the third interconnect each comprise a noble metal.

2. The structure of claim 1, wherein the oxide is tantalum oxide or titanium oxide.

3. The structure of claim 1, wherein the first air-gap and the second air-gap are fully located at a depth above a depth of the trench.

4. The structure of claim 1, wherein the second portion of the barrier layer is positioned below the first portion of the barrier layer in the first via, in the second via, and in the trench.

5. The structure of claim 1, wherein the noble metal is ruthenium, niobium, rhodium, iridium, or platinum.

6. The structure of claim 1, wherein the first interconnect, the second interconnect, and the third interconnect have a line width in a range of 6 nm to 20 nm.

7. The structure of claim 6, wherein the noble metal is ruthenium.

8. A structure comprising:
   a dielectric matrix;
   a first via extending completely through the dielectric matrix;
   a second via extending completely through the dielectric matrix;
   a trench extending partially through the dielectric matrix, the trench arranged laterally between the first via and the second via;
   a first interconnect in the first via;
   a second interconnect in the second via;
   a third interconnect in the trench;
   a first air-gap arranged laterally between the trench and the first via;
   a second air-gap arranged laterally between the trench and the second via; and
   a barrier layer having respective portions lining the first via, the second via, and the trench, the respective portions of the barrier layer located in the first via, in the second via, and in the trench below respective portions of dielectric material
   wherein the respective portions of dielectric material directly contact the first interconnect, the second interconnect, and the third interconnect, the first air-gap and the second air-gap are fully surrounded by therespective portions of dielectric material, and the first interconnect, the second interconnect, and the third interconnect each comprise a noble metal.

9. The structure of claim 8, wherein the noble metal is ruthenium, niobium, rhodium, iridium, or platinum.

10. The structure of claim 8, wherein the first air-gap and the second air-gap are fully located at a depth above a depth of the trench.

11. The structure of claim 8, wherein the first interconnect, the second interconnect, and the third interconnect have a line width in a range of 6 nm to 20 nm.

12. The structure of claim 11, wherein the noble metal is ruthenium.

* * * * *

UNITED STATES PATENT AND TRADEMARK OFFICE
CERTIFICATE OF CORRECTION

PATENT NO. : 10,679,937 B2
APPLICATION NO. : 15/785665
DATED : June 9, 2020
INVENTOR(S) : Xunyuan Zhang Page 1 of 1

It is certified that error appears in the above-identified patent and that said Letters Patent is hereby corrected as shown below:

In the Claims

Column 8, Claim 8, Line 28-29, change "therespective" to --the respective--

Signed and Sealed this
Fourteenth Day of July, 2020

Andrei Iancu
*Director of the United States Patent and Trademark Office*